(12) United States Patent
Huang et al.

(10) Patent No.: US 7,791,385 B2
(45) Date of Patent: Sep. 7, 2010

(54) SPREAD SPECTRUM CLOCK GENERATING APPARATUS

(75) Inventors: Hong-Yi Huang, Taipei (TW); Li-Wei Huang, Taipei (TW); Yuan-Hua Chu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/045,712

(22) Filed: Mar. 11, 2008

(65) Prior Publication Data

US 2009/0140782 A1    Jun. 4, 2009

(30) Foreign Application Priority Data

Dec. 3, 2007    (TW) ............................... 96145914 A

(51) Int. Cl.
*H03L 7/00* (2006.01)

(52) U.S. Cl. .................. 327/160; 327/159; 327/150; 327/151; 375/347

(58) Field of Classification Search .................. 327/141, 327/144–163; 331/15–17; 375/373–376
See application file for complete search history.

(56) References Cited

U.S. PATENT DOCUMENTS

| | | | |
|---|---|---|---|
| 4,979,183 A | 12/1990 | Cowart | |
| 5,488,627 A | 1/1996 | Hardin et al. | |
| 5,539,770 A | 7/1996 | Ishigaki | |
| 5,610,955 A | 3/1997 | Bland | |
| 5,631,920 A | 5/1997 | Hardin | |
| 5,659,587 A | 8/1997 | Knierim | |
| 5,943,382 A | 8/1999 | Li et al. | |
| 6,292,507 B1 | 9/2001 | Hardin et al. | |
| 6,366,174 B1 | 4/2002 | Berry et al. | |
| 6,404,834 B1 | 6/2002 | Hardin et al. | |
| 6,559,698 B1 | 5/2003 | Miyabe | |
| 6,647,052 B2 | 11/2003 | Hailey | |
| 6,703,901 B2* | 3/2004 | Jovenin et al. | ............... 331/1 A |
| 6,703,902 B2 | 3/2004 | Jeon et al. | |
| 6,919,744 B2* | 7/2005 | Paist et al. | .................. 327/115 |
| 7,161,970 B2 | 1/2007 | Lim et al. | |
| 2004/0165691 A1* | 8/2004 | Rana | ............................ 377/48 |
| 2005/0036579 A1* | 2/2005 | Shiraishi | ...................... 375/375 |
| 2007/0176691 A1* | 8/2007 | Batchelor et al. | ............. 331/16 |

OTHER PUBLICATIONS

Article titled "A Spread Spectrum Clock Generator for SATA-II" authored by Chen et al., ISCAS, pp. 2643-2646, Mar. 2005.

(Continued)

*Primary Examiner*—Lincoln Donovan
*Assistant Examiner*—Brandon S Cole
(74) *Attorney, Agent, or Firm*—Jianq Chyun IP Office

(57) ABSTRACT

A spread spectrum clock generating apparatus is disclosed. The spread spectrum clock generating apparatus includes a phase lock loop module and a spread spectrum module. The phase lock loop module is used for dynamically tuning frequency of an output clock. The spread spectrum module includes a counter, a plurality of delta-sigma counters and a data shifter. These delta-sigma counters accumulate input signals, and enable a first overflow signal while accumulation of a last stage delta-sigma counter is overflowed. The frequency of the output clock can be tuned dynamically according to the first overflow signal, and the spectrum of the output clock can be spread.

5 Claims, 13 Drawing Sheets

OTHER PUBLICATIONS

Article titled "A Low-Jitter 5000ppm Spread Spectrum Clock Generator for Multi-channel SATA Transceiver in 0.18um CMOS" authored by Lee, et al., IEEE International Solid-State Circuits Conference Feb. 2005, pp. 162-163.

Article titled "A Low-Jitter Added SSCG with Seamless Phase Selection and Fast AFC for 3rd Generation Serial-ATA" authored by Shin et al., IEEE2006 Custom Intergrated Circuits Conference (CICC), pp. 409-412.

Article titled "Spread-Spectrum Clock Generator for Serial ATA using Fractional PLL Controlled by Modulator with Level Shifter" authored by Kokubo et al., 2005 IEEE International Solid-State Circuits Conference, pp. 160-161.

Article titled "Spread Spectrum Clock Generation for the Reduction of Radiated Emissions" Hardin et al., Electromagnetic Compatibility, 1994. Symposium Record. Compatibility in the Loop., IEEE International Symposium on Volume , Issue , Aug. 22-26, 1994 pp. 227-231.

* cited by examiner

SPREAD SPECTRUM CLOCK GENERATING APPARATUS

CROSS-REFERENCE TO RELATED APPLICATION

This application claims the priority benefit of Taiwan application serial no. 96145914, filed on Dec. 3, 2007. The entirety of the above-mentioned patent application is hereby incorporated by reference herein and made a part of this specification.

BACKGROUND OF THE INVENTION

1. Field of the Invention

The present invention relates to a spread spectrum clock generating apparatus. More particularly, the present invention relates to a spread spectrum clock generating apparatus which may apply delta-sigma counters of two stages to control a fractional frequency divider.

2. Description of Related Art

With development of electronic industrial technology, functions of electronic devices are increased. Accordingly, data transmission among different electronic devices is an important function thereof. However, parallel data transmission used to be regarded as an optimal transmission approach is gradually changed with development of serial data transmission technique. To effectively save a transmission bandwidth, priority of the serial data transmission is greater than that of the parallel data transmission. However, since the serial data transmission has a characteristic of high clock frequency, a problem of electromagnetic interference (EMI) occurs. The U.S. federal communications commission (FCC) provides several strict rules related to the EMI problem, by which engineers may reduce the EMI by means of shielding, filtering or adjusting a circuit layout.

A spread spectrum technique is to slowly modulate a system clock within a small range to continuously tune a working frequency thereof within a limited range. By continuously tuning a clock transition frequency, noises generated due to the clock transition may be evenly distributed on different spectrums for decreasing energy thereof, so as to decrease the EMI. Therefore, such spread spectrum technique is a most popular approach for solving the EMI problem. Conventional spread spectrum clock generators mainly include three types of structures as direct frequency synthesis, low-pass filter modulation and fractional frequency divider.

FIG. 1 is a diagram of a conventional spread spectrum clock generator 100 with direct frequency synthesis. The spread spectrum clock generator 100 with direct frequency synthesis generates an output clock CKOUT via a phase lock loop (PLL) module 130 thereof according to a comparison result between an input clock CKIN and a feedback clock BK. A spread spectrum method thereof is to directly add an external spread spectrum module 110 to a last stage phase delayer 120 of the PLL module 130, so as to directly adjust a phase delay rate of the phase delayer 120 to implement the spectrum spreading. Though such conventional spread spectrum technique is the simplest, when it is applied to the spread spectrum clock generator with high output frequency, the spread spectrum module 110 is hard to be designed for synthesizing and modulating the high output frequency.

Moreover, FIG. 2 is a diagram of another conventional spread spectrum clock generator 200 with direct frequency synthesis. The spread spectrum clock generator 200 with low-pass filter modulation generates the output clock CKOUT via a PLL module 240 thereof according to the comparison result between the input clock CKIN and the feedback clock BK. A spread spectrum module 210 may adjust an output signal of a charge pump circuit 220 for providing to a low-pass filter 230, so as to adjust the frequency of the output clock CKOUT. Similar to the aforementioned spread spectrum clock generator 100 with direct frequency synthesis, the spread spectrum clock generator 200 with direct frequency synthesis is hard to be designed for satisfying a requirement of outputting the output clock CKOUT with high frequency. Accordingly, utilization of such conventional technique is limited.

FIG. 3 is a diagram of a third conventional spread spectrum clock generator 300 with a fractional frequency divider. The spread spectrum clock generator 300 with a fractional frequency divider generates the output clock CKOUT via a PLL module 330 thereof according to a comparison result between the input clock CKIN and the feedback clock BK. A fractional frequency divider 320 may provide different divisors within different time segment under control of a spread spectrum module 310 for fine tuning multiples of the output clock CKOUT and the feedback clock BK, so as to spread the frequency of the output clock CKOUT. However, the spread spectrum module 310 of such conventional technique is generally a complicated control circuit with a relatively high cost. For example, a so-called delta-sigma counter is generally applied to such realm, and to achieve an effective spread spectrum effect, relatively more number of bits of the delta-sigma counter are generally required. Therefore, size of the circuit is greatly increased, which is of no avail to the cost thereof.

SUMMARY OF THE INVENTION

Examples of the present invention may provide a spread spectrum clock generating with a fractional frequency divider apparatus, which may dynamically adjust frequency of an output clock, so as to reduce noise energy generated during clock transition.

Examples of the present invention may provide a spread spectrum clock generating apparatus including a phase lock loop (PLL) module and a spread spectrum module. The PLL module has a control terminal for receiving a first overflow signal and controlling a frequency ratio (i.e. a frequency multiplication ratio) between frequencies of an output clock and an input clock. The spread spectrum module is coupled to the PLL module for dynamically adjusting the frequency of the output clock. The spread spectrum module includes a counter, N delta-sigma counters and N−1 data shifters.

The counter generates N counting signals according to a feedback clock, wherein N is an integer greater than 1. A counting direction of the counter is determined according to a counting control signal. The N delta-sigma counters are used for accumulating the corresponding received counting signals and overflow shifting values, so as to generate a first overflow signal and N−1 second overflow signals. Moreover, the N−1 data shifters are respectively coupled between two of the delta-sigma counters. The N−1 data shifters respectively receive N−1 shifting values and shift the corresponding received second overflow signal, so as to generate the overflow shifting values.

In the present invention, the delta-sigma counters with multi-stage structure are applied, and therefore not only spectrum spreading of high frequency clocks may be achieved, but also circuit area is reduced and efficiency of noise suppression is improved, so that an optimal function thereof is achieved while maintaining a low cost.

In order to make the aforementioned and other objects, features and advantages of the present invention comprehensible, an embodiment accompanied with figures is described in detail below.

DESCRIPTION OF EMBODIMENTS

Figure 1:
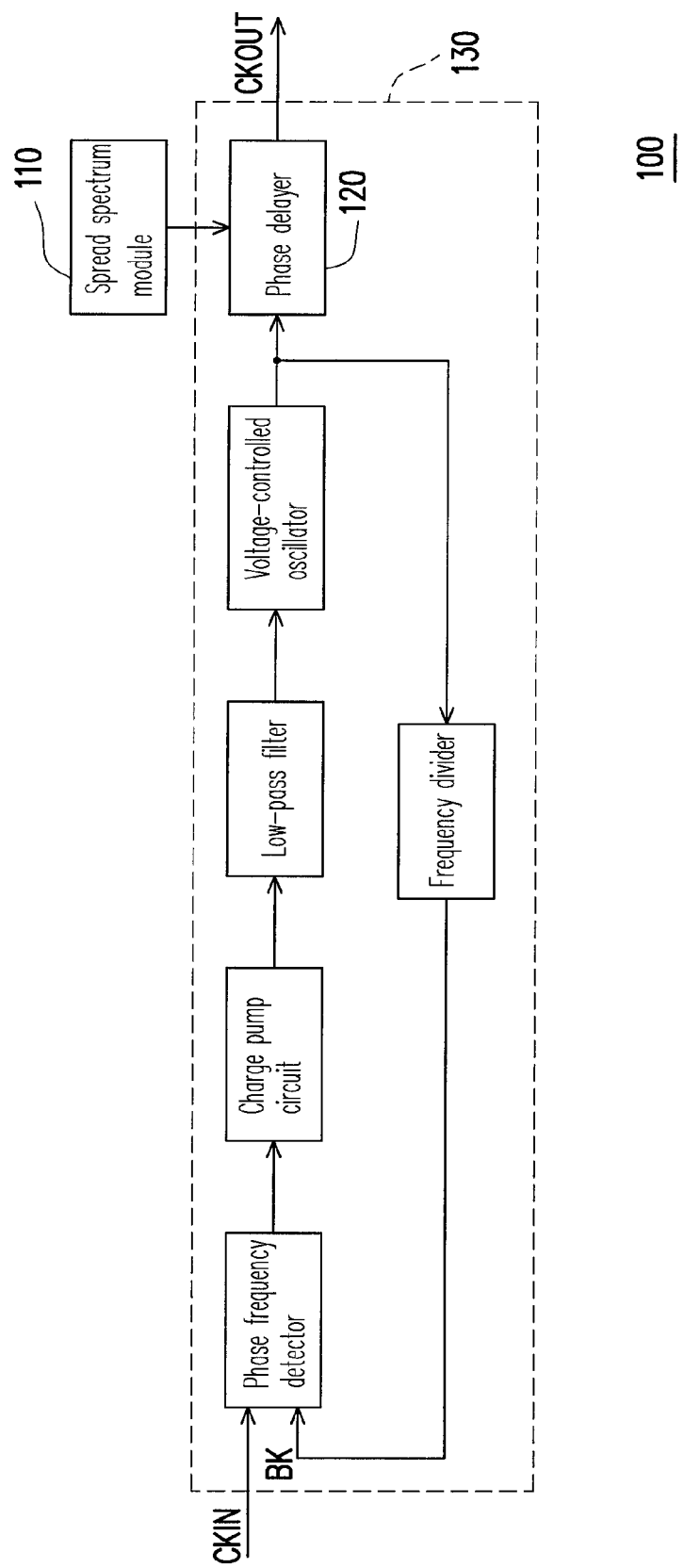
FIGS. 1-3 are diagrams of a conventional spread spectrum clock generator for direct frequency synthesis.
Figure 2:
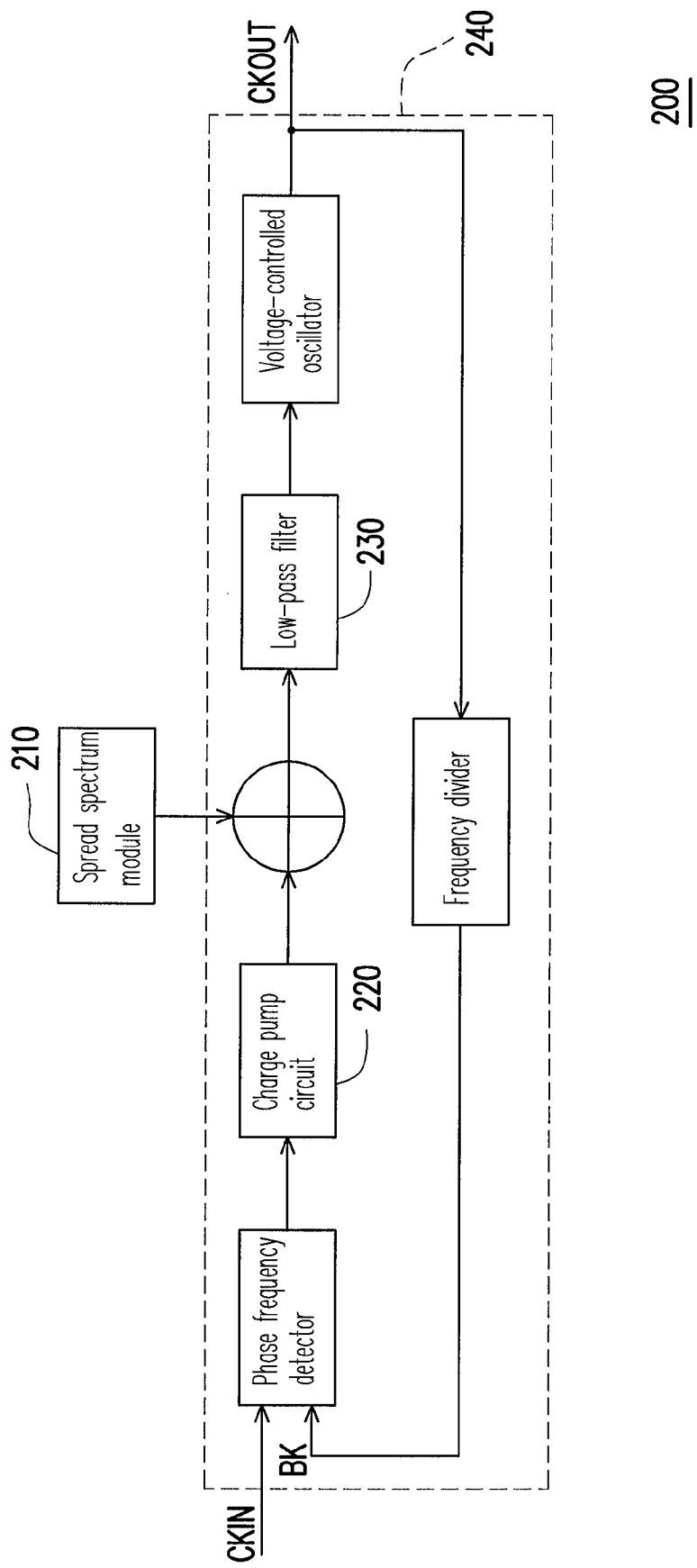
Figure 3:
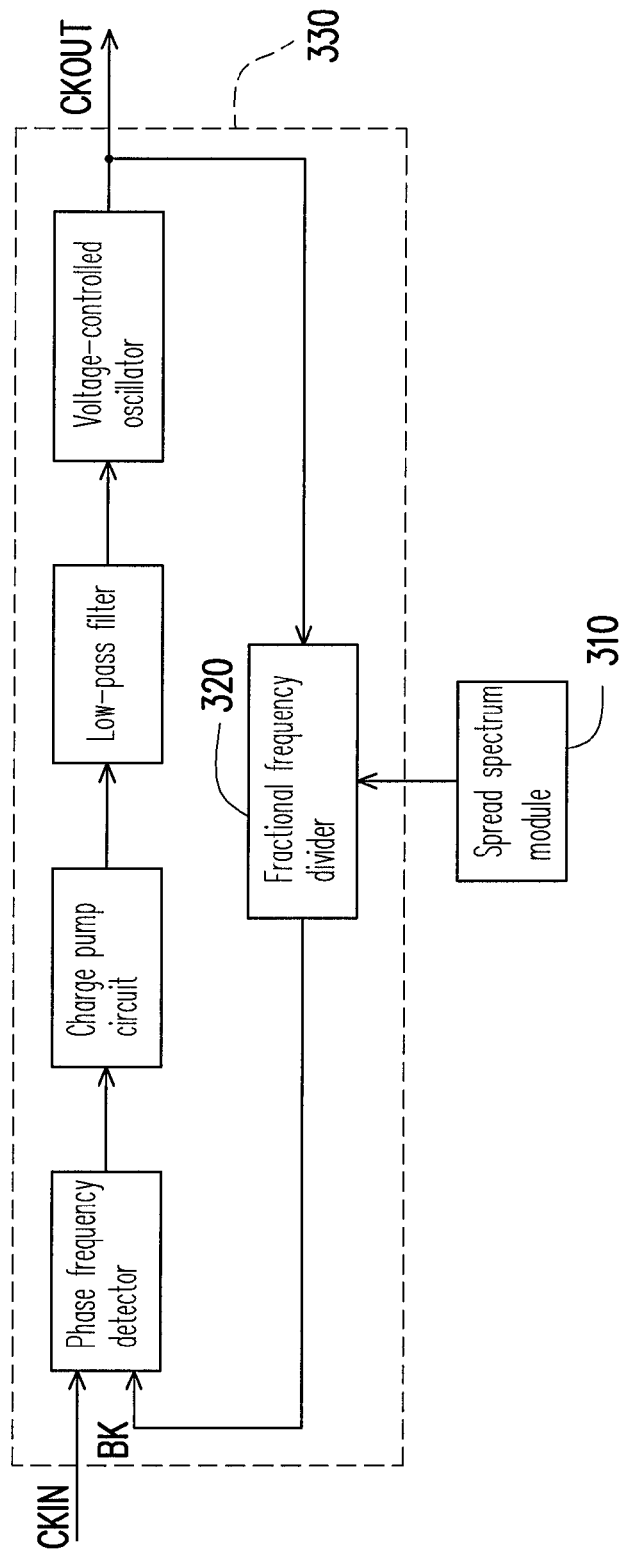
Figure 4A:
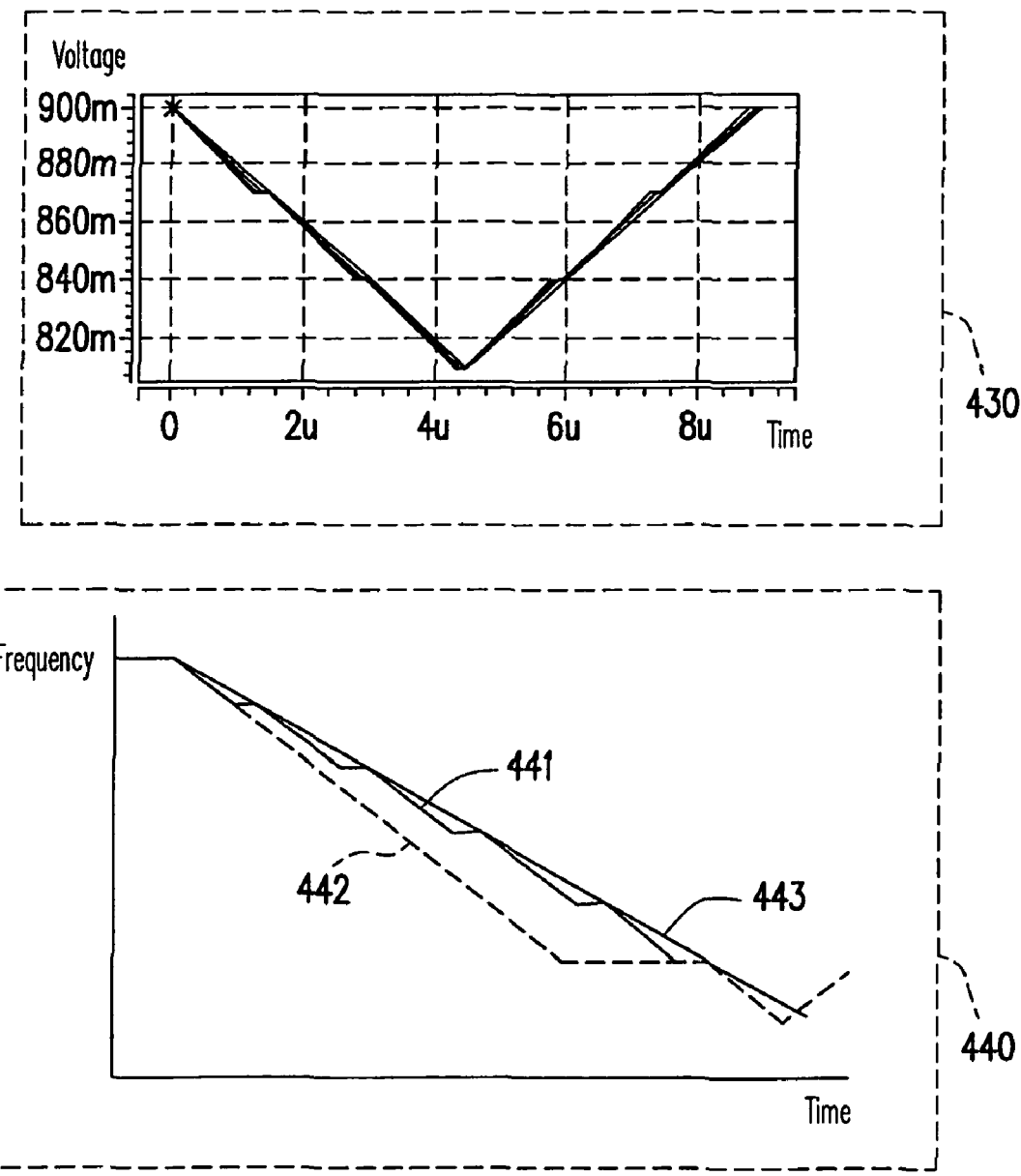
FIG. 4A is a diagram illustrating a relationship between spread spectrum control voltages and time.
Figure 4B:
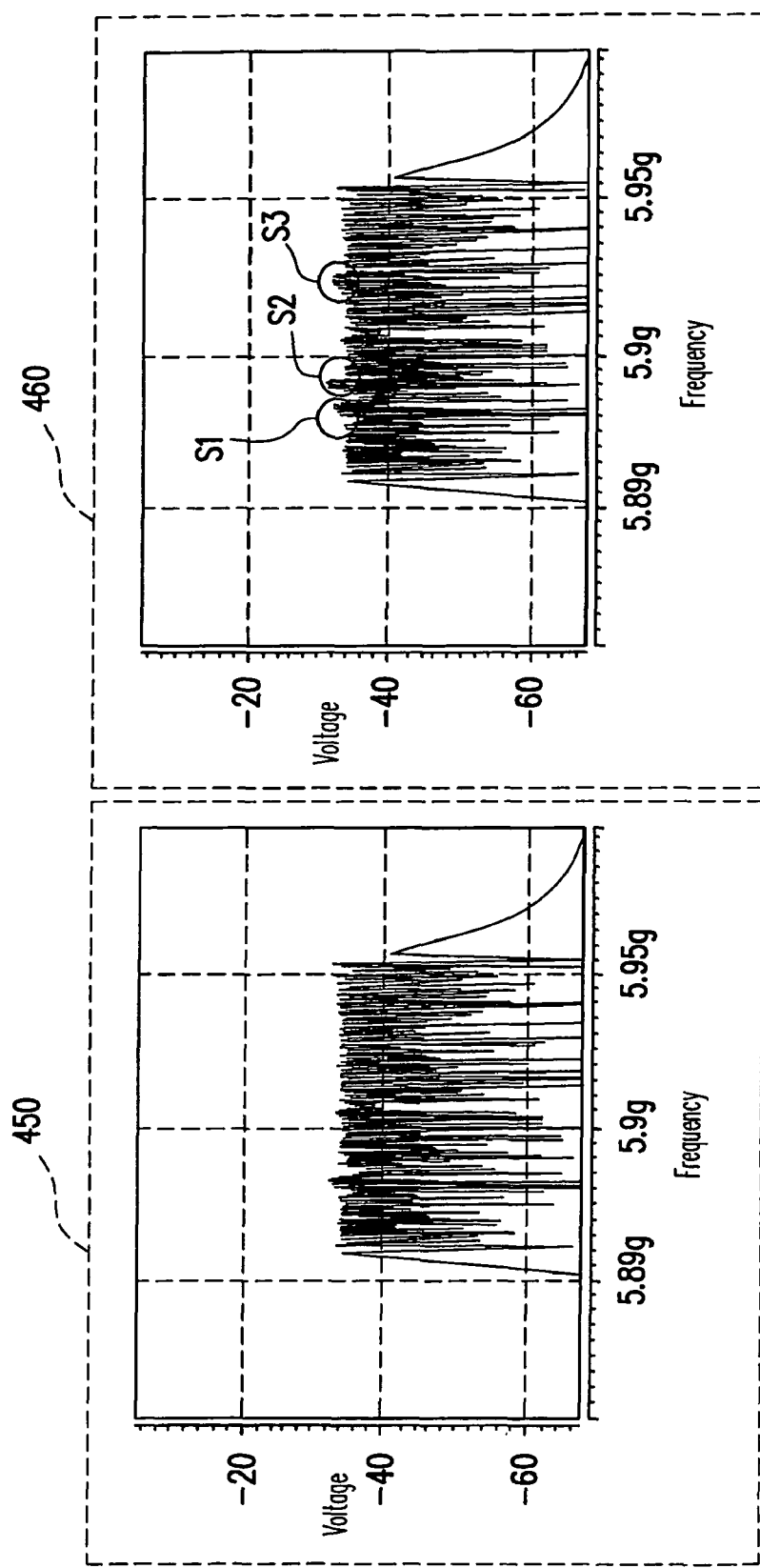
FIG. 4B is a spectrum diagram of an output clock CKOUT.

Before embodiments of the present invention are described, spread spectrum principle of a spread spectrum generating apparatus is introduced for fully conveying the spirit and scope of the present invention to those skilled in the art. Referring to FIG. 4A and FIG. 4B. FIG. 4A is a diagram illustrating a relationship between spread spectrum control voltages and time. FIG. 4B is a spectrum diagram of an output clock CKOUT. Wherein, when the spread spectrum control voltage decreases along with the time, frequency of the output clock generated by the spread spectrum clock generating apparatus decreases accordingly. Conversely, when the spread spectrum control voltage increases along with the time, the frequency of the output clock generated by the spread spectrum clock generating apparatus increases accordingly. Wherein, the spread spectrum clock generating apparatus may decrease or increase the spread spectral control voltage in a triangle-wave mode shown as a waveform diagram of 430, so as to achieve the spread spectrum effect.

However, an actual circuit cannot generate spread spectrum control voltages with a perfect triangle-wave mode, as shown in a waveform diagram 440 (which is an enlarged diagram of the waveform diagram 430). Wherein, a curve 442 is a curve of the spread spectrum control voltages actually generated based on a conventional technique. The curve 442 is quite different from an ideal curve 443, and turning points thereof are uneven, so that the spectrum diagram of the output clock CKOUT generated thereof is shown as a waveform diagram 460 of FIG. 4B. In the diagram 460, surges S1, S2 and S3 represent that the output clock CKOUT has relatively great noise. Moreover, a curve 441 of FIG. 4A has a plurality of even turning points, so that the curve 441 is more closed to the ideal curve 443. Therefore, the spectrum diagram of the output clock CKOUT generated under control of the spread spectrum control voltages of the curve 441 is shown as a waveform diagram 450 of FIG. 4B, which is a relatively smooth spectrum diagram.

Now, to further convey the spirit and the scope of the present invention to those skilled in the art, a further description of how the spread spectrum clock generating apparatus generates the spread spectrum control voltages as that shown in the curve 443 will be set forth herein.

Figure 4C:
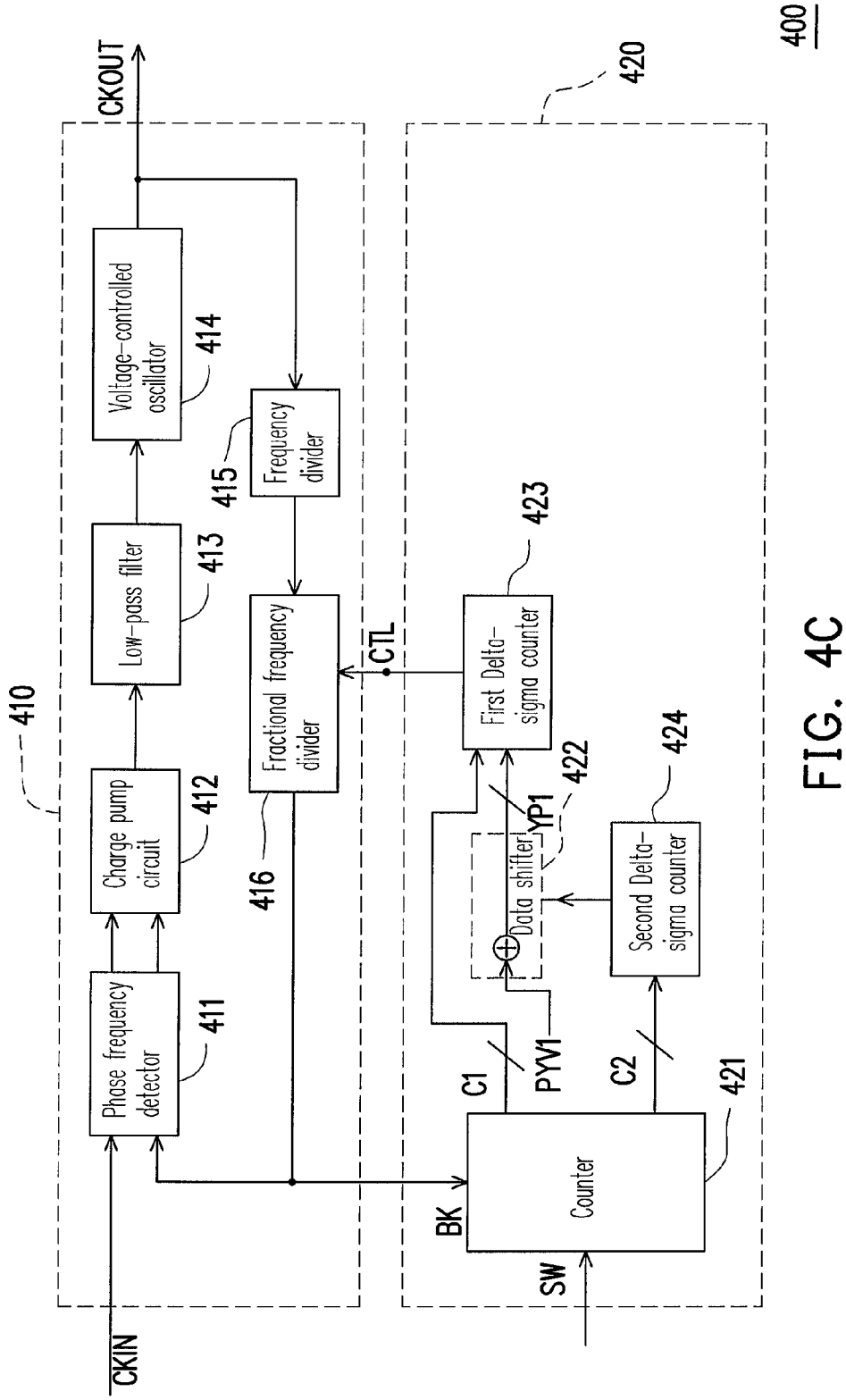
FIG. 4C is a diagram of a spread spectrum clock generating apparatus according to an embodiment of the present invention.

FIG. 4C is a diagram of a spread spectrum clock generating apparatus 400 according to an embodiment of the present invention. The spread spectrum clock generating apparatus 400 includes a PLL module 410 and a spread spectrum module 420. The spread spectrum module 420 is coupled to a feedback terminal BK of the PLL module 410 and a control terminal CTL of the PLL module 410. The spread spectrum clock generating apparatus 400 is used for dynamically adjusting the frequency of the output clock CKOUT according to the spread spectrum control voltage transmitted to the control terminal CTL.

In the spread spectrum clock generating apparatus 400, an input terminal of the PLL module 410 receives an input clock CKIN, and the feedback terminal of the PLL module 410 transmits a feedback clock BK. The PLL module 410 generates the output clock CKOUT by comparing phases and frequencies of the feedback clock BK and the input clock CKIN. The output terminal of the PLL module 410 outputs the output clock CKOUT. The PLL module 410 is used for providing the output clock CKOUT, wherein and a ratio between the frequency of the output clock CKOUT and that of the input clock CKIN is a frequency multiplication ratio. The control terminal CTL of the PLL module 410 receives a first overflow signal for controlling the frequency multiplication ratio.

The spread spectrum module 420 provides the first overflow signal to the control terminal CTL of the PLL module 410. The spread spectrum module 420 includes a counter 421, a data shifter 422, a delta-sigma counter 423 and a delta-sigma counter 424. The counter 421 includes a clock input terminal, a first output terminal, a second output terminal and a control terminal. The clock input terminal of the counter 421 receives the feedback clock BK and takes the feedback clock BK as a counting clock for generating counting signals C1 and C2. The first output terminal of the counter 421 outputs the counting signal C1, and the second output terminal of the counter 421 outputs the counting signal C2. The control terminal of the counter 421 is coupled to a control signal SW. The control signal SW controls a counting direction of the counter 421 for increasing or decreasing. The counting signals C1 and C2 output from the counter 421 are equivalent to the spread spectrum control voltages. When the counting direction of the counting signals increases, it represents the spread spectrum control voltages deviates from standard values. In other words, spectrum spreading of the frequency of the output clock CKOUT is increased. Conversely, when the counting direction of the counting signals decreases, it represents the spread spectrum control voltages are close to the standard values. In other words, the spectrum spreading of the frequency of the output clock CKOUT is decreased.

Moreover, the delta-sigma counter 424 includes an input terminal and an output terminal. The input terminal of the delta-sigma counter 424 receives the counting signal C2. The delta-sigma counter 424 accumulates the counting signal C2 and enables the overflow signal while accumulation of the delta-sigma counter 424 is overflowed. The output terminal of the delta-sigma counter 424 outputs a second overflow signal. It should be noted that the counting signal C2 is actually a fine-tuning part of the spread spectrum control voltage.

The data shifter 422 includes a first input terminal, a second input terminal and an output terminal, wherein the first terminal receives a shifting value PYV1, the second terminal receives the overflow signal generated by the delta-sigma counter 424, and the output terminal transmits an overflow shifting value YP1. Moreover, in the present embodiment, the data shifter 422 is an adder (which is only used for an embodiment, and other circuit which may cause a data shifting effect may also be applied herein, for example, a subtracter). Wherein, the overflow shifting value YP1 is equal to the shifting value PYV1 plus the overflow signal generated by the delta-sigma counter 424, and is a rough-tuning part of the spread spectrum control voltage.

Similarly, an input terminal of the delta-sigma counter 423 receives the overflow shifting value YP1 and the counting signal C1. The delta-sigma counter 433 is used for accumulating the overflow shifting value YP1 and the counting signal C1, and enabling the first overflow signal while accumulation of the delta-sigma counter 423 is overflowed. The shifting value PYV1 is used for shifting a counting range of the delta-sigma counter 423, so that the delta-sigma counter 423 may start counting with a value other than 0. Selection of the shifting value PYV1 relates to specification of the spread spectrum, which will be described in detail in the following content.

Referring to FIG. 4C again, in the present embodiment, to select a range of the spread spectrum, inputting range of the delta-sigma counters 423 and 424 has to be predetermined. A relationship between the frequency of the output clock CKOUT and the frequency of the input clock CKIN may be expressed by the following equation.

$$CKOUT = CKIN \times R1 \times (N1 - \Delta N1 \times (1 - (X+Y/8)/(X+1))) \quad (1)$$

Wherein R1 is a frequency division ratio of a frequency divider 415 of the PLL module 410; N1 is a selectable frequency division ratio of a fractional frequency divider 416; $\Delta N1$ is a difference between another selectable frequency division ratio of the fractional frequency divider 416 and N1; X is the counting range of the delta-sigma counter 423 and Y is the counting range of the delta-sigma counter 424.

Taking a serial advanced technology attachment (SATA) as an example, a required spread ratio thereof has to be less than 5000 ppm, wherein the frequency division ratio R1 of the frequency divider 415 of the PLL module 410 is 4. The selectable frequency division ratio N1 of the fractional frequency divider 416 is set to 15, and the difference $\Delta N1$ between another selectable frequency division ratio of the fractional frequency divider 416 and N1 is set to 0.5. If the above values are input to the equation (1), and in coordination with the requirement of the spread ratio being less than 5000 ppm, the counting range X of the first delta-sigma counter 423 is then 17~19. Namely, the shifting value PYV1 has to be set to 16. The counting range Y of the delta-sigma counter 424 is 1~8. Referring to the following equations (2)~(4):

$$CKOUT(MAX) = CKIN \times 4 \times (15 - 0.5 \times (1 - (19+8/8)/20)) = CKIN \times 60 \quad (2)$$

$$CKOUT(MIN) = CKIN \times 4 \times (15 - 0.5 \times (1 - (17+1/8)/20)) = CKIN \times 59.7125 \quad (3)$$

Spread ratio=1−59.7125/60=4791.6 ppm  (4)

Wherein CKOUT(MAX) is a maximum value of the output clock CKOUT, and CKOUT(MIN) is a minimum value of the output clock CKOUT. It should be noted that the principle of the present invention is to implement a relatively great spread ratio by applying delta-sigma counters with multi stages, and match a requirement of minimum circuit area. In the present embodiment, only two stages of the delta-sigma counters are applied. However, it is only an embodiment for the SATA specification, and the present invention is not limited thereto.

In addition, the PLL module 410 includes a phase frequency detector 411, a charge pump circuit 412, a low-pass filter 413, a voltage-controlled oscillator 414 and a fractional frequency divider 416. The phase frequency detector 411 has a first input terminal, a second input terminal and an output terminal, wherein the first input terminal receives the input clock CKIN, and the second input terminal receives the feedback clock BK. The phase frequency detector 411 compares the frequencies and phases of the input clock CKIN and the feedback clock BK, and outputs a comparison result by the output terminal of the phase frequency detector 411. The charge pump circuit 412 has an input terminal and an output terminal, wherein the input terminal is coupled to the output terminal of the phase frequency detector 411. The charge pump circuit 412 is used for integrating the output terminal of the phase frequency detector 411 and generating an integration result signal. The integration result signal is then transmitted to a next stage, namely, to the voltage-controlled oscillator 414.

The voltage-controlled oscillator 414 generates the output clock CKOUT according to the voltage of the integration result signal received from the low-pass filter 413. The fractional frequency divider 416 has an input terminal, an output terminal and a control terminal, wherein the input terminal receives the output clock CKOUT, and the control terminal CTL is coupled to the first overflow signal. The fractional frequency divider 416 divides the frequency of the output clock CKOUT according to the first overflow signal, so as to generate the feedback clock BK and transmit the feedback signal BK to the output terminal of the fractional frequency divider 416. Moreover, the PLL module 410 further includes a frequency divider 415. The frequency divider 415 is coupled between the voltage-controlled oscillator 414 and the fractional frequency divider 416 and is used for increasing the frequency division ratio between the output clock CKOUT and the feedback clock BK, so as to increase the frequency multiplication ratio between the input clock CKIN and the output clock CKOUT.

Figure 5A:
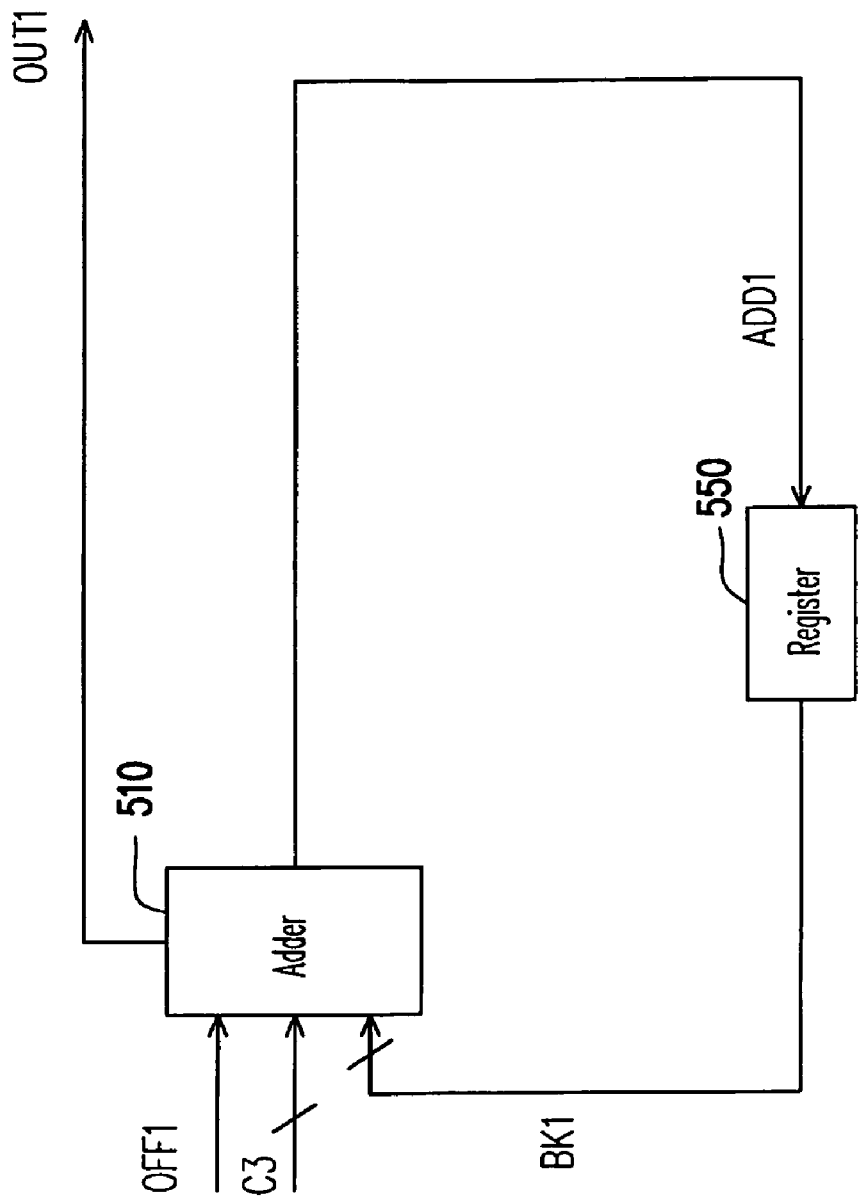
FIG. 5A is a diagram illustrating a delta-sigma counter according to an embodiment of the present invention.

FIG. 5A is a diagram illustrating a delta-sigma counter 423 according to an embodiment of the present invention. The delta-sigma counter 423 includes an adder 510 and a register 550. The adder 510 has a first input terminal, a second input terminal, a feedback input terminal, an output terminal and an overflow output terminal, wherein the first input terminal receives a counting signal C3, the second input terminal receives an overflow shifting value OFF1, and the feedback input terminal receives a first feedback signal BK1. Moreover, the output terminal of the delta-sigma counter 434 outputs a first output signal ADD1 equals to the overflow shifting value OFF1 plus the counting signal C3 and the first feedback signal BK1. When accumulation of the delta-sigma counter 423 is greater than a predetermined value, a first overflow signal OUT1 is enabled and transmitted to the overflow output terminal of the adder 510. Wherein, the predetermined value is the maximum counting value of the delta-sigma counter 423, and in the example of the SATA, the predetermined value is 19.

In addition, the register 550 has an input terminal and an output terminal, wherein the input terminal is coupled to the output terminal of the adder 510, and the output terminal of the register 550 is coupled to the feedback input terminal of the adder 510 for transmitting the first feedback signal BK1.

The register 550 is used for delaying the first output signal ADD1 to form the first feedback signal BK1.

Figure 5B:
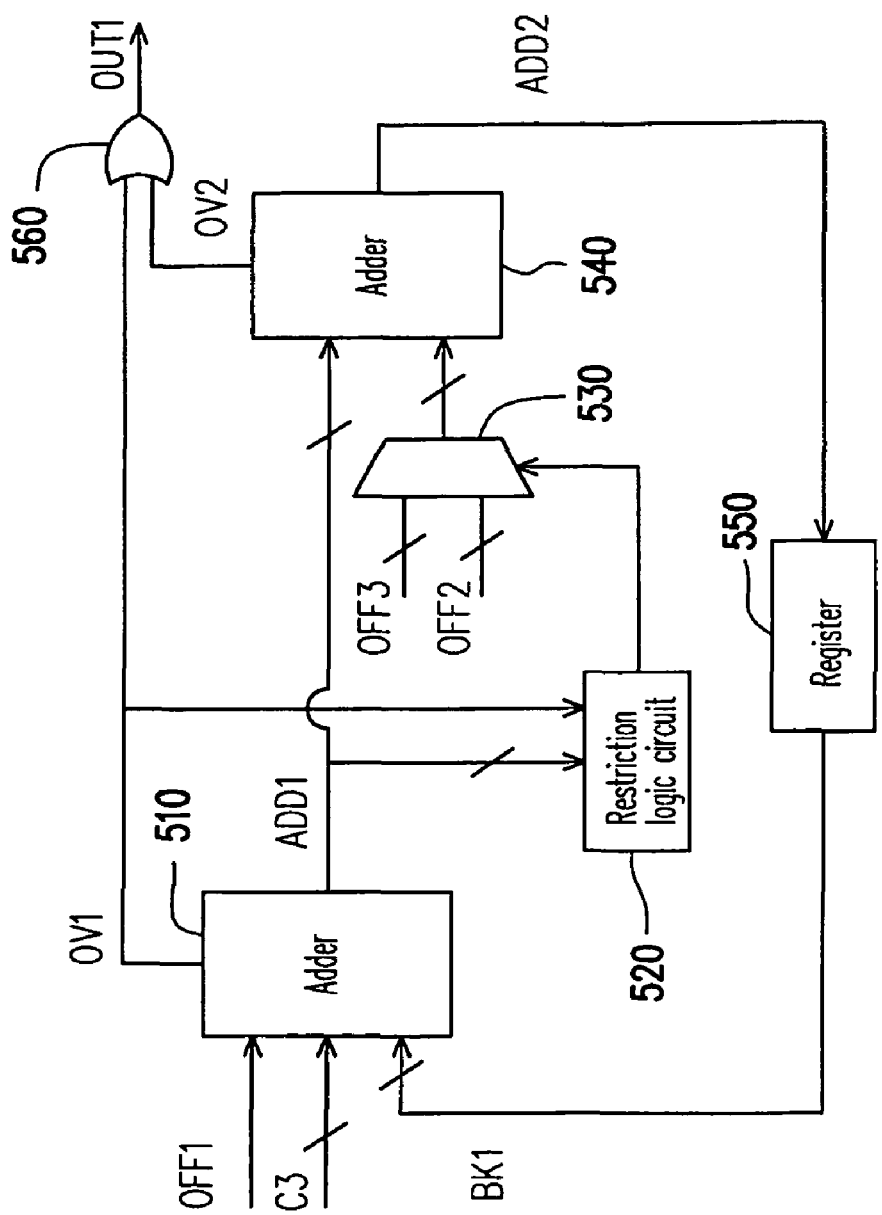
FIG. 5B is a diagram illustrating a delta-sigma counter according to another embodiment of the present invention.

Referring to FIG. 5B, FIG. 5B is a diagram illustrating a delta-sigma counter 423 according to another embodiment of the present invention. To successfully implement overflow of the delta-sigma counter 423, the delta-sigma counter 423 of the present embodiment further includes a selector 530, a restriction logic circuit 520, an adder 540 and an OR gate 560. The selector 530 has a first input terminal, a second input terminal, an output terminal and a control terminal, wherein the output terminal is coupled to a second input terminal of the adder 540, the first input terminal of the selector 530 receives a shifting value OFF2, and the second input terminal of the selector 530 receives a shifting value OFF3. Moreover, the output terminal of the selector 530 outputs a shifted output value, and the control terminal of the selector 530 receives a control signal. The restriction logic circuit 520 has a first input terminal, a second input terminal and an output terminal, wherein the first input terminal is coupled to the output terminal of the adder 510, the second input terminal is coupled to an overflow output terminal OV1 of the adder 510, and the output terminal of the restriction logic circuit 520 is coupled to the control terminal of the selector 530.

Moreover, the adder 540 has a first input terminal, a second input terminal, an output terminal and an overflow output terminal, wherein the first input terminal receives the first output signal ADD1, the second input terminal receives the shifted output value, and the overflow output terminal OV2 outputs an overflow state generated when the adder 540 performs an adding calculation. The adder 540 is used for adding the first output signal ADD1 with the shifted output value, so as to generate a second output signal, and the second output signal is transmitted to the output terminal of the adder 540. The OR gate 560 has a first input terminal, a second input terminal and an output terminal, wherein the first input terminal is coupled to the overflow output terminal OV1 of the adder 510, the second output terminal is coupled to the overflow output terminal OV2 of the adder 540, and the output terminal is coupled to the first overflow signal OUT1.

The restriction logic circuit 520 detects whether or not the accumulation result of the adder 510 is greater than the predetermined value, and enables/disables a first selection signal to be transmitted to the selector 530. When the first selection signal is enabled, the shifted output value equals to the first shifting value. Conversely, when the first selection signal is disabled, the shifted output value equals to the second shifting value. In the present embodiment, the adder 510 is a 5-bits adder. Therefore, the second shifting value is set to 0, and the first shifting value OFF1 is 12. The first shifting value OFF1 is forced to be overflowed (the maximum value of the 5-bits adder is 31) by adding 12 when the first output signal ADD1 is greater than the predetermined value 19 and equal to 20, and the accumulation result of the adder 510 equals to 20 plus 12 minus 31, i.e. equals to 1, and the second output signal ADD2 then equals to 1. When the accumulation result of the adder 510 is less than the predetermined value 19, the shifted output value is then the second shifting value 0, by which accumulation result of the adder 510 is not changed, and the first output signal ADD1 equals to the second output signal ADD2.

Regardless of the adder 510 or the adder 540 being overflowed, it all represents the accumulation of the first delta-sigma counter 423 that exceeds the predetermined value 19 and is overflowed, and the first overflow signal OUT1 is generated by the OR gate 560.

Figure 6:
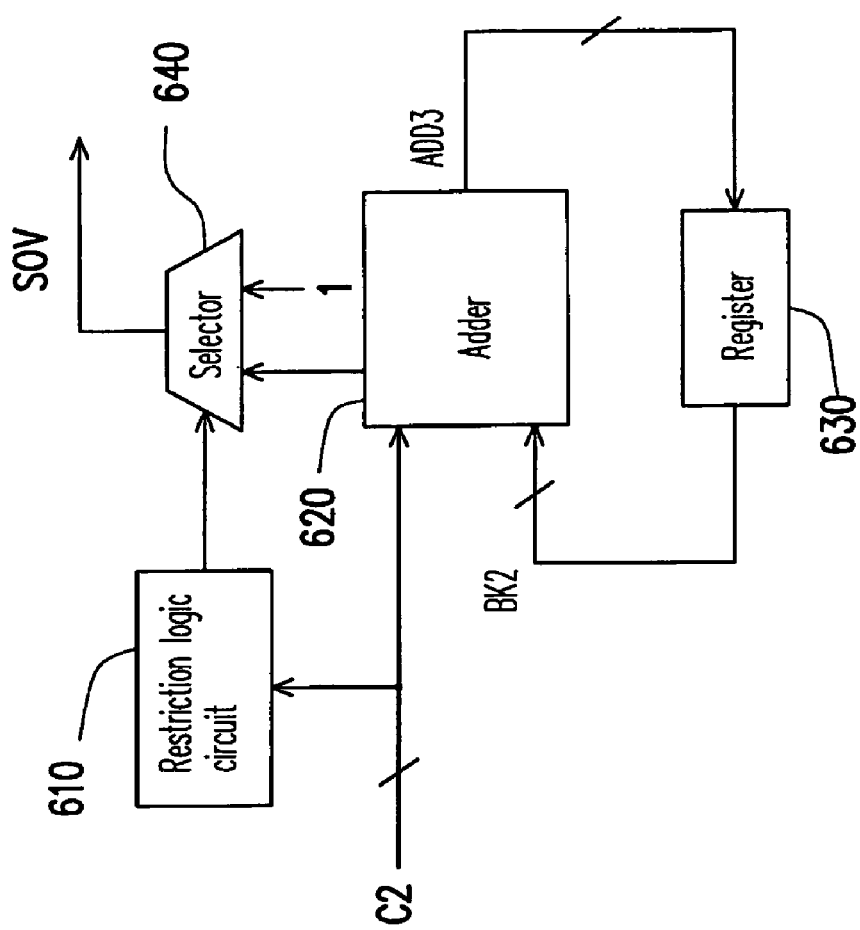
FIG. 6 is a diagram illustrating a delta-sigma counter according to still another embodiment of the present invention.

FIG. 6 is a diagram illustrating a delta-sigma counter 424 according to an embodiment of the present invention. The delta-sigma counter 424 includes an adder 620 and a register 630. The adder 620 has a first input terminal, a feedback input terminal, an output terminal and an overflow output terminal, wherein the first input terminal of the adder 620 receives the counting signal C2, the feedback input terminal receives the second feedback signal BK2, and the output terminal outputs a third output signal ADD3. When the second feedback signal BK2 plus the counting signal C2 is greater than a predetermined value, a second overflow signal SOV is enabled. The overflow output terminal of the adder 620 outputs the second overflow signal SOV. The predetermined value is the maximum counting value of the delta-sigma counter 424. In the embodiment where the SATA is applied, this predetermined value is 8. Moreover, the delta-sigma counter 424 further includes a restriction logic circuit 610 and a selector 640. The restriction logic circuit 610 and the selector 640 are coupled between the counting signal C2 and the adder for aiding to generate the second overflow signal SOV on the output terminal of the selector 640 during overflow.

The register 630 has an input terminal and an output terminal, wherein the input terminal receives the third output signal ADD3. The register 630 is used for delaying the third output signal ADD3 and generating the second feedback signal BK2. The output terminal of the register 630 is coupled to the feedback input terminal of the adder 630, and outputs the second feedback signal BK2.

Figure 7:
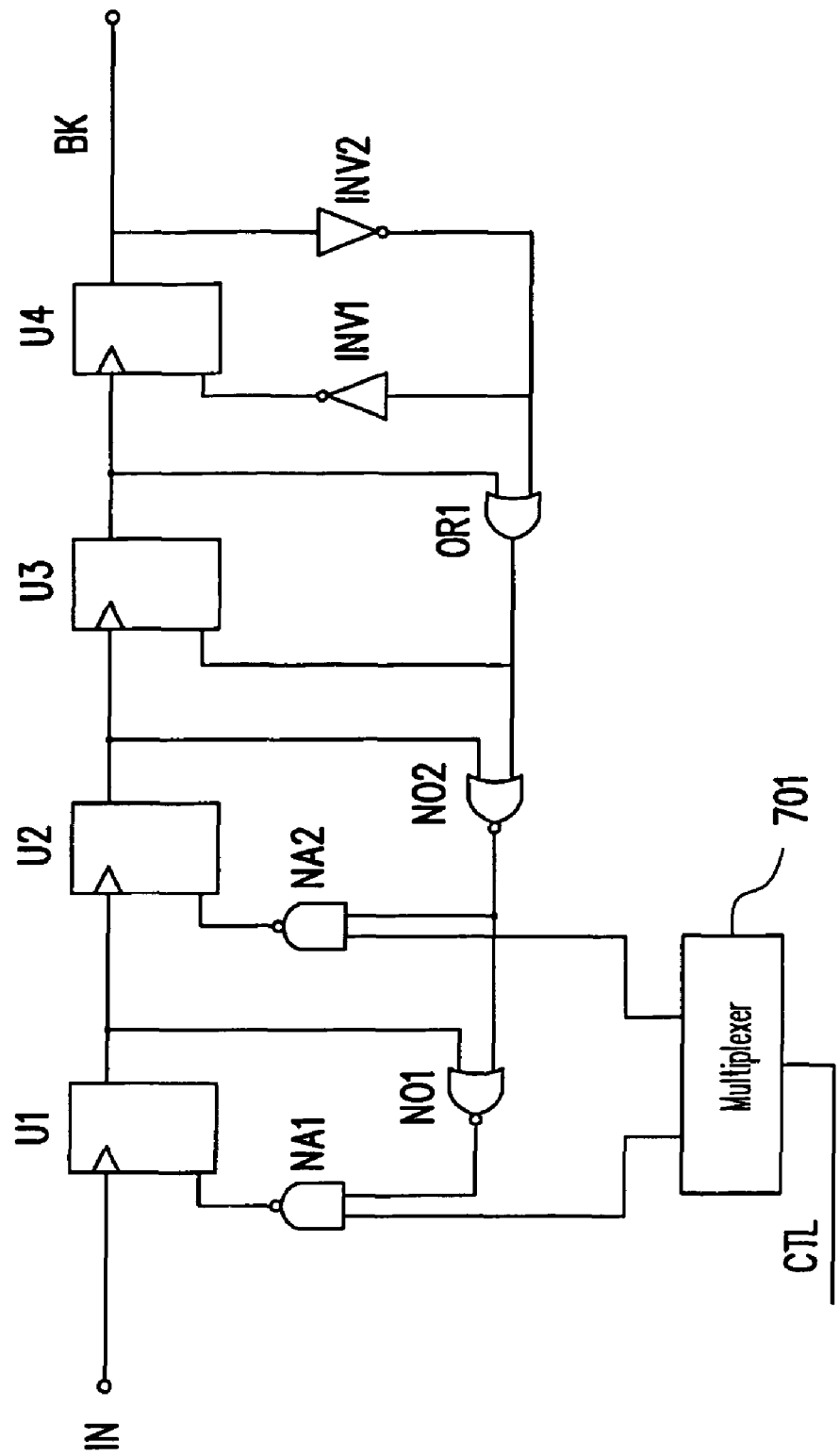
FIG. 7 is a diagram illustrating a fractional frequency divider according to an embodiment of the present invention.

FIG. 7 is a diagram illustrating a fractional frequency divider according to an embodiment of the present invention. Referring to FIG. 7, the fractional frequency divider includes fractional frequency-dividing units U1~U4, a multiplexer 701, a NOR gate NO1, a NOR gate NO2, a NAND gate NA1, a NAND gate NA2, an OR gate OR1, a NOT gate INV1 and a NOT gate INV2. The fractional frequency-dividing units U1~U4 are circuit components that may be divided by 1 or 1.5. Coupling method of these circuit components of the fractional frequency divider is as follows.

The fractional frequency-dividing unit U1 has a clock input terminal, a control terminal and an output terminal, wherein the clock input terminal receives an input clock IN. The multiplexer 701 has an input terminal, a first output terminal and a second output terminal, wherein the input terminal CTL receives the first overflow signal. The NOR gate NO1 has a first input terminal, a second input terminal and an output terminal, wherein the first input terminal is coupled to the output terminal of the fractional frequency-dividing unit U1. The NAND gate NA1 has a first input terminal, a second input terminal and an output terminal, wherein the first input terminal is coupled to the first output terminal of the multiplexer 701, the second input terminal of the NAND gate NA1 is coupled to the output terminal of the first NOR gate NO1, and the output terminal thereof is coupled to the control terminal of the fractional frequency-dividing unit U1. The fractional frequency-dividing unit U2 has a clock input terminal, a control terminal and an output terminal, wherein the clock input terminal is coupled to the output terminal of the fractional frequency-dividing unit U1. The NAND gate NA2 has a first input terminal, a second input terminal and an output terminal, wherein the first input terminal is coupled to the second output terminal of the multiplexer 701, the second input terminal of the NAND gate NA2 is coupled to the second input terminal of the NOR gate NO1, and the output terminal thereof is coupled to the control terminal of the fractional frequency-dividing unit U2. The NOR gate NO2 has a first input terminal, a second input terminal and an output terminal, wherein the output terminal is coupled to the second input terminal of the NOR gate NO1, and the first input terminal is coupled to the output terminal of the fractional frequency-dividing unit U2.

Moreover, the fractional frequency-dividing unit U3 has a clock input terminal, a control terminal and an output terminal, wherein the clock input terminal is coupled to the first input terminal of the NOR gate N02, and the control terminal is coupled to the second input terminal of the NOR gate N02. The OR gate OR1 has a first input terminal, a second input terminal and an output terminal, wherein the output terminal is coupled to the second input terminal of the NOR gate NO2, the first input terminal is coupled to the output terminal of the fractional frequency-dividing unit U3. The fractional frequency-dividing unit U4 has a clock input terminal, a control terminal and an output terminal, wherein the clock input terminal is couple to the output terminal of the fractional frequency-dividing unit U3, and the output terminal outputs the feedback clock BK. Moreover, the NOT gate INV1 has an input terminal and an output terminal, wherein the input terminal is coupled to the second input terminal of the OR gate OR1, the output terminal is coupled to the control terminal of the fractional frequency-dividing unit U4. The NOT gate INV2 has an input terminal and an output terminal, wherein the input terminal is coupled to the output terminal of the fractional frequency-dividing unit U4, and the output terminal is coupled to the input terminal of the NOT gate INV1.

In the fractional frequency divider of the present embodiment, the input terminal CTL thereof is used for receiving the first overflow signal. If an output signal B0 of the multiplexer 701 generated in response to the first overflow signal is 0, and an output signal B1 is 1, the fractional frequency divider is a frequency divider divided by 14.5. Conversely, if the output signal B1 of the multiplexer 701 generated in response to the first overflow signal is 0, and the output signal B0 is 1, the fractional frequency divider is a frequency divider divided by 15.

Figure 8:
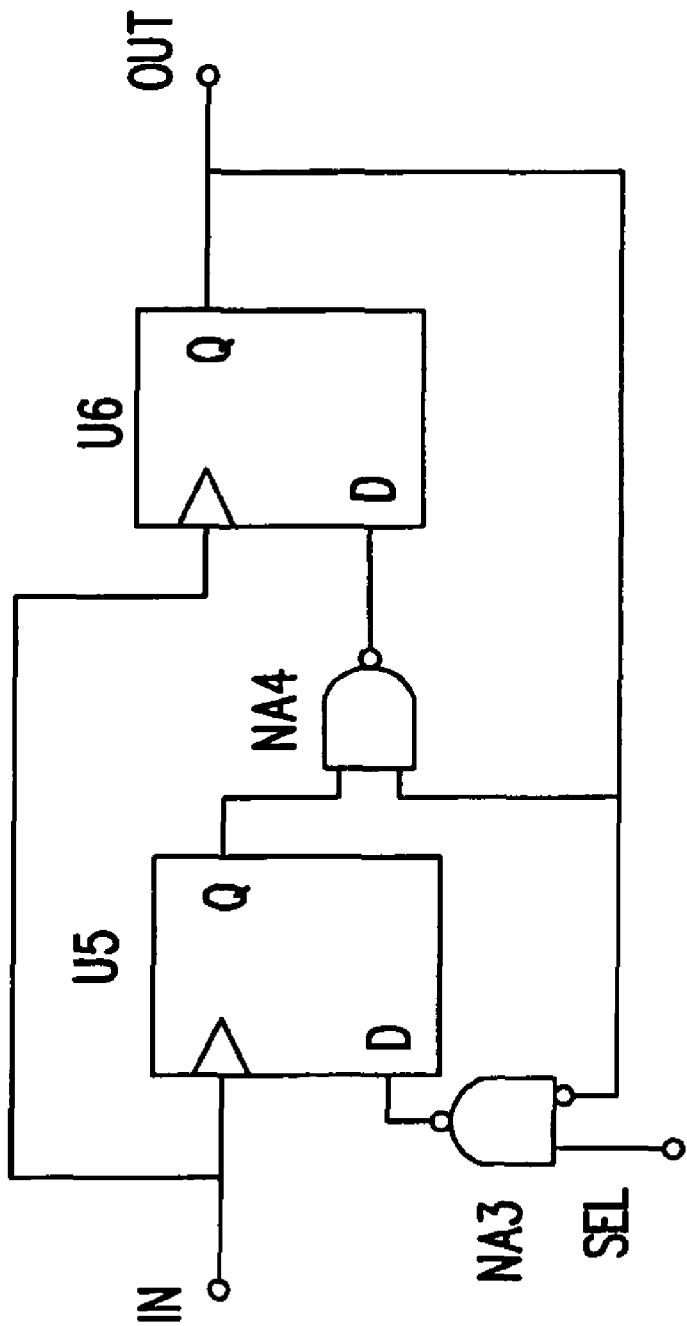
FIG. 8 is a diagram illustrating a fractional frequency-dividing unit according to an embodiment of the present invention.

FIG. 8 is a diagram illustrating a fractional frequency-dividing unit according to an embodiment of the present invention. Referring to FIG. 8, the fractional frequency-dividing unit includes a double edge triggered flip-flop U5, a double edge triggered flip-flop U6, a NAND gate NA3 and a NAND gate NA4. The double edge triggered flip-flop U5 has a clock terminal, a data terminal and an output terminal, wherein the clock terminal is coupled to the clock input terminal IN of the fractional frequency-dividing unit. The NAND gate NA3 has an output terminal, an input terminal and inverted input terminal, wherein the input terminal is coupled to the control terminal SEL of the fractional frequency-dividing unit, the output terminal is coupled to the data terminal of the double edge triggered flip-flop U5. The NAND gate NA4 has an output terminal, a first input terminal and a second input terminal, wherein the first input terminal is coupled to the output terminal of the double edge triggered flip-flop U5, the second input terminal is coupled to the inverted input terminal of the NAND gate NA3. The double edge triggered flip-flop U6 has a clock terminal, a data terminal and an output terminal, wherein the clock terminal is coupled to the clock input terminal of the fractional frequency-dividing unit, the data terminal is coupled to the output terminal of the NAND gate NA4, and the output terminal OUT is coupled to the output terminal of the fractional frequency-dividing unit.

The fractional frequency-dividing unit is a frequency divider which may be divided by 1 or 1.5. The divisor may be selected according to the level of the control terminal SEL. If the level of the control terminal SEL is 0, the level of the output terminal of the NAND gate NA3 maintains 1, such that the double edge triggered flip-flop U6 may function as a T-type flip-flop, and the fractional frequency-dividing unit functions as a circuit divided by 2. In coordination with an effect of the double edge triggered flip-flop, the fractional frequency-dividing unit functions as a circuit divided by 1. Moreover, if the level of the control terminal SEL is 1, the NAND gate NA3 functions as a NOT gate, and the fractional frequency-dividing unit functions as a circuit divided by 3. Similarly, in coordination with the effect of the double edge triggered flip-flop, the fractional frequency-dividing unit functions as a circuit divided by 1.5.

Figure 9:
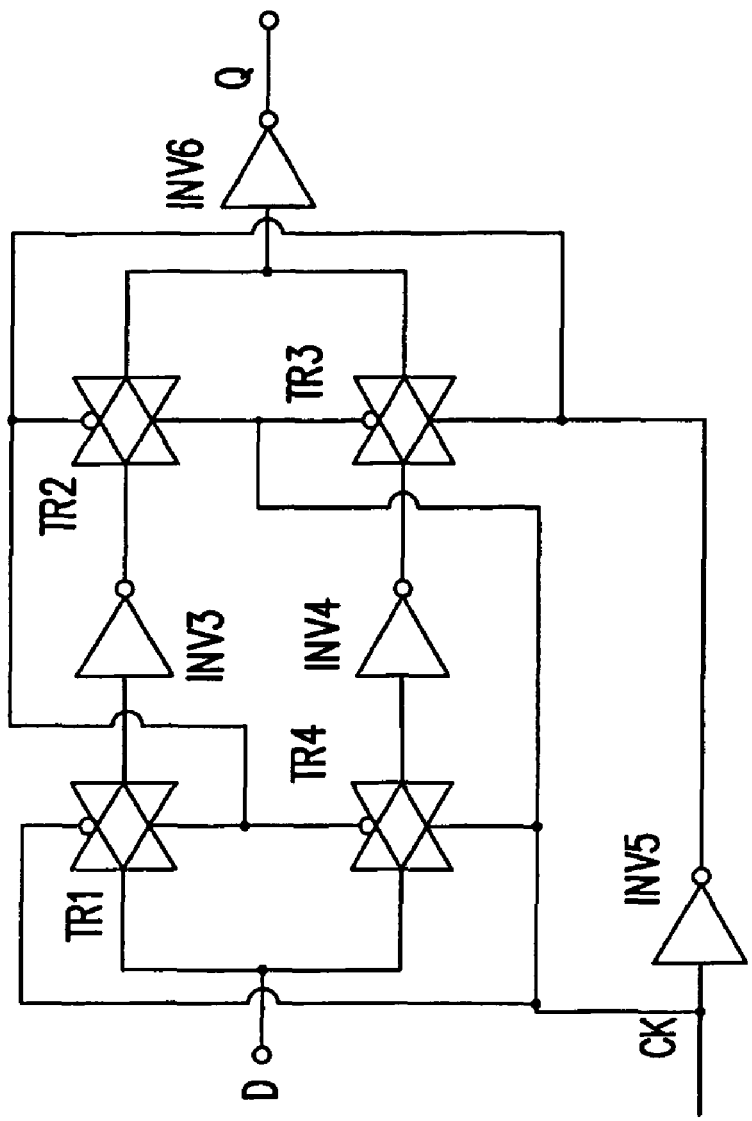
FIG. 9 is a diagram of a double edge triggered flip-flop according to an embodiment of the present invention.

FIG. 9 is a diagram of a double edge triggered flip-flop according to an embodiment of the present invention. Referring to FIG. 9, the double edge triggered flip-flop includes NOT gates INV3~INV6 and transmission gates TR1~TR4. The NOT gate INV 6 has an input terminal and an output terminal, wherein the input terminal is coupled to the clock terminal CK of the double edge triggered flip-flop. The transmission gate TR1 has an input terminal, an output terminal, a first clock terminal and a second clock terminal, wherein the input terminal is coupled to the data terminal D of the double edge triggered flip-flop, the first clock terminal is coupled to the output terminal of the NOT gate INV6, the second clock terminal is coupled to the input terminal of the NOT gate INV5. The NOT gate INV3 has an input terminal and an output terminal, wherein the input terminal is coupled to the output terminal of the transmission gate TR1. The transmission gate TR2 has an input terminal, an output terminal, a first clock terminal and a second clock terminal, wherein the input terminal is coupled to the output terminal of the NOT gate INV3, the first clock terminal is coupled to the input terminal of the NOT gate INV5, and the second clock terminal is coupled to the output terminal of the NOT gate INV5.

Moreover, the NOT gate INV6 has an input terminal and an output terminal, wherein the input terminal is coupled to the output terminal of the transmission gate TR2, the output terminal is coupled to the output terminal Q of the double edge triggered flip-flop. The transmission gate TR4 has an input terminal, an output terminal, a first clock terminal and a second clock terminal, wherein the input terminal is coupled to the input terminal of transmission gate TR1, the first clock terminal is coupled to the input terminal of the NOT gate INV5, the second clock terminal is coupled to the output terminal of the NOT gate INV5. The NOT gate INV4 has an input terminal and an output terminal, wherein the input terminal is coupled to the output terminal of the transmission gate TR4. The transmission gate TR3 has an input terminal, an output terminal, a first clock terminal, and a second clock terminal, wherein the input terminal is coupled to the output terminal of the NOT gate INV4, the first clock terminal is coupled to the output terminal of the NOT gate INV5, the second clock terminal is coupled to the input terminal of the NOT gate INV5, and the output terminal is coupled to the input terminal of the NOT gate INV6.

When the level of the clock terminal CK of the double edge triggered flip-flop maintains 0, the signal received from the data terminal D maintains within the transmission gate TR1. When the level of the clock terminal CK is transited from 0 to 1, the signal received from the data terminal D is transmitted from the transmission gate TR1 to the transmission gate TR2 via the NOT gate INV3, and further transmitted to the output terminal Q. Meanwhile, the signal received from the data terminal D maintains within the transmission gate TR4 since the level of the clock terminal CK maintains 1. When the level of the clock terminal CK is transited from 1 to 0, the signal received from the data terminal D is transmitted from the transmission gate TR4 to the transmission gate TR3 via the NOT gate INV4, and further transmitted to the output terminal Q. Therefore, at a positive edge and a negative edge of a clock, the double edge triggered flip-flop likewise performs a related operation, which may accelerate operation of the circuit.

Figure 10:
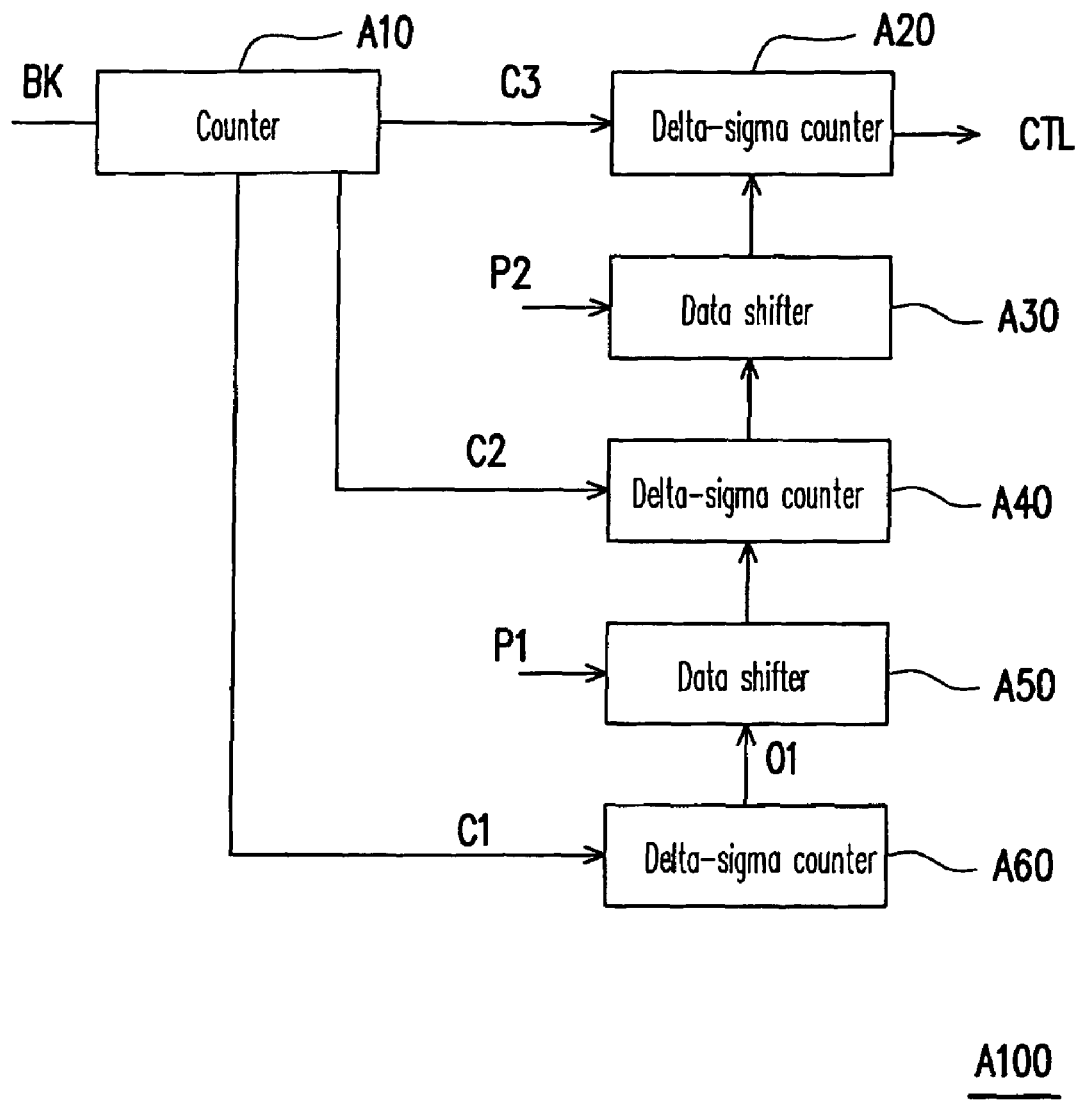
FIG. 10 is a diagram of a spread spectrum module according to an embodiment of the present invention.

Moreover, a spread spectrum module composed of a plurality of delta-sigma counters is further provided. FIG. 10 is a diagram of a spread spectrum module according to an embodiment of the present invention. The spread spectrum module A100 includes a counter, N delta-sigma counters and N−1 data shifters, wherein N is an integer greater than 1. In the present embodiment, three (i.e. N=3) delta-sigma counters are applied, which respectively are delta-sigma counter A20, delta-sigma counter A40 and delta-sigma counter A60. Two (i.e. number of the delta-sigma counters minus 1) data shifters are applied, which respectively are data shifter A30 and data shifter A50. The data shifter A30 is coupled between the delta-sigma counter A20 and the delta-sigma counter A40, and the data shifter A50 is coupled between the delta-sigma counter A40 and the delta-sigma counter A60.

In the spread spectrum module A00, the counter A10 generates three counting signals C1~C3 for providing to the delta-sigma counters A60, A40 and A20 according to the feedback clock BK. The delta-sigma counter A60 accumulates the counting signal C1 to generate an overflow signal O1. The data shifter A50 shifts the overflow signal O1 according to the shifting value P1, and transmits the shifted overflow shifting value to the delta-sigma counter A40. Deduced by analogy, the overflow signal CTL then may be obtained at the last stage, i.e. at the delta-sigma counter A20. Then, the PLL module may implement the spread spectrum effect under control of the overflow signal.

It should be noted that the present embodiment is only an example for the spread spectrum module composed of the plurality of delta-sigma counters, in which the three delta-sigma counters and the two data shifters utilized are only for an example, the present invention is not limited thereto, more delta-sigma counters and more data shifters may also be applied without departing from the spirit and scope of the present invention.

In summary, two delta-sigma counters are applied in the present invention to implement the spread spectrum function. Therefore, complexity of the spread spectrum module and the circuit area thereof may be reduced. Moreover, the spread control voltages are more close to an ideal triangle, and accordingly a better spread spectrum effect may be achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A spread spectrum clock generating apparatus, comprising:

a phase lock loop (PLL) module, having a control terminal for receiving a first overflow signal, for controlling a frequency multiplication ratio between a frequency of an output clock and a frequency of an input clock; and a spread spectrum module, coupled to the PLL module, for dynamically adjusting frequency of the output clock, the spread spectrum module comprising:

a counter, for generating N counting signals according to a feedback clock, wherein N is an integer greater than 1, and the counter determines a counting direction according to a counting control signal; and N delta-sigma counters, for accumulating the counting signals and N−1 overflow shifting values, and generating the first overflow signal and N−1 second overflow signals, wherein each of the delta-sigma counters comprises:

a first adder, having a first input terminal, a second input terminal, a feedback input terminal, an output terminal and an overflow output terminal, wherein the first input terminal receives one of the counting signals, the second input terminal receives one of the overflow shifting values, the feedback input terminal receives a first feedback signal, and the output terminal outputs a first output signal, wherein the first output signal is sum of values of the first input terminal, the second input terminal and the feedback input terminal, and the first overflow signal is enabled and transmitted to the overflow output terminal when the adder is overflowed;

a first register, having an input terminal and an output terminal, wherein the input terminal is coupled to the output terminal of the first adder, the output terminal is coupled to the feedback input terminal of the first adder for transmitting the first feedback signal, wherein the first register is used for delaying the first output signal to form the first feedback signal;

a first selector, having a first input terminal, a second input terminal, an output terminal, and a selection terminal, wherein the first input terminal receives a first shifting value, the second input terminal receives a second shifting value, the output terminal outputs a shifted output value, and the selection terminal receives a first selection signal, and wherein when the first selection signal is enabled, the shifted output value equals to the first shifting value, and when the first selection signal is disabled, the shifted output value equals to the second shifting value;

a first restriction logic circuit, having a first input terminal, a second input terminal and an output terminal, wherein the first input terminal is coupled to the output terminal of the first adder, the second input terminal is coupled to the overflow output terminal of the first adder, the output terminal is coupled to the control terminal of the first selector, wherein the first restriction logic circuit is used for judging whether or not the first output signal is greater than a first predetermined value or whether or not the first overflow signal is enabled, so as to generate the first selection signal and transmit the first selection signal to the output terminal of the first restriction logic circuit;

a second adder, having a first input terminal, a second input terminal, an output terminal and an overflow output terminal, and disposed between the first adder and the first register, wherein the first input terminal receives the first output signal, the second input terminal receives the shifted output value, the output terminal is coupled to the input terminal of the first register, and the overflow output terminal outputs an overflow state generated when the second adder performs an adding operation, wherein the second adder is used for adding the first output signal with the shifted output value, so as to generate a second output signal and transmit the second output signal to the output terminal of the second adder; and an OR gate, having a first input terminal, a second input terminal and an output terminal, wherein the first input terminal is coupled to the overflow output terminal of the first adder, the second input terminal is coupled to the overflow output terminal of the second adder, and the output terminal is coupled to an output terminal of a first sigma-delta modulator, wherein functions of a circuit formed by the OR gate, the second adder, the first restriction logic circuit and the first selector is that when the first output signal is greater than the first predetermined value, the second adder is overflowed by adding the first shifting value to the first output signal, and the second output signal equals to the first output signal minus the first predetermined value, and when the first output signal is less than or equal to the first predetermined value, the second output signal equals to the first output signal; and N−1 data shifters, respectively coupled between two of the delta-sigma counters, wherein each of the data shifters receives one of N−1 shifting values and shifts one of the second overflow signals to generate one of the overflow shifting values.

2. The spread spectrum clock generating apparatus as claimed in claim 1, wherein the delta-sigma counters further comprise:

a third adder, having a first input terminal, a feedback input terminal, an output terminal and an rounding output terminal, wherein the first input terminal receives one of the counting signals, the feedback input terminal receives a second feedback signal, and the output terminal outputs a third output signal, wherein the third output signal is sum of values of the first input terminal and the feedback input terminal, and a rounding signal is enabled and transmitted to the rounding output terminal when the adder is overflowed;

a second register, having an input terminal and an output terminal, wherein the input terminal is coupled to the output terminal of the third adder, the output terminal is coupled to the feedback input terminal of the third adder for transmitting the second feedback signal, wherein the second register is used for delaying the third output signal to form the second feedback signal;

a second restriction logic circuit, having an input terminal and an output terminal, wherein the input terminal is coupled to the first input terminal of the third adder, and the output terminal outputs a second selection signal; and a second selector, having a first input terminal, a second input terminal, an output terminal and a selection terminal, wherein the first input terminal is coupled to the rounding output terminal of the third adder, the second input terminal is coupled to a second predetermined value, the selection terminal is coupled to the second selection signal, and the output terminal is coupled to the output terminal of the delta-sigma counter, wherein a circuit formed by the second restriction logic circuit and the second selector is used for enabling the second overflow signal when an accumulation result of the third adder is greater than a third predetermined value.

3. A spread spectrum clock generating apparatus, comprising:

a phase lock loop (PLL) module, having a control terminal for receiving a first overflow signal, for controlling a frequency multiplication ratio between a frequency of an output clock and a frequency of an input clock, wherein the PLL module comprises:

a phase frequency detector, having a first input terminal, a second input terminal and an output terminal, wherein the first input terminal receives the input clock, and the second input terminal receives the feedback clock, the phase frequency detector compares frequencies and phases of the input clock and the feedback clock to generate a differential signal, and the differential signal is transmitted to the output terminal of the phase frequency detector;

a charge pump circuit, having an input terminal and an output terminal, wherein the input terminal is coupled to the output terminal of the phase frequency detector, the charge pump circuit is used for integrating the differential signal and generating an integration result signal, and the integration result signal is transmitted to the output terminal of the charge pump circuit;

a low-pass filter, having an input terminal and an output terminal, wherein the input terminal is coupled to the output terminal of the charge pump circuit, the low-pass filter filters high frequency noise of the integration result signal and generates a low frequency signal, and the low frequency signal is transmitted to the output terminal of the low-pass filter;

a voltage-controlled oscillator, coupled to the output terminal of the low-pass filter, for generating the output clock according to the low frequency signal; and a fractional frequency divider, having an input terminal, an output terminal and a control terminal, wherein the input terminal receives the output clock, the control terminal is coupled to the first overflow signal, the fractional frequency divider divides frequency of the output clock according to the first overflow signal to generate the feedback clock, and the feedback clock is transmitted to the output terminal of the fractional frequency divider, wherein the fractional frequency divider comprises:

a first fractional frequency-dividing unit, having a clock input terminal, a control terminal and an output terminal, wherein the clock input terminal receives the output clock;

a multiplexer, having an input terminal, a first output terminal and a second output terminal, wherein the input terminal receives the first overflow signal;

a first NOR gate, having a first input terminal, a second input terminal and an output terminal, wherein the first input terminal is coupled to the output terminal of the first fractional frequency-dividing unit;

a first NAND gate, having a first input terminal, a second input terminal and an output terminal, wherein the first input terminal is coupled to the first output terminal of the multiplexer, the second input terminal is coupled to the output terminal of the first NOR gate, and the output terminal is coupled to the control terminal of the first fractional frequency-dividing unit;

a second fractional frequency-dividing unit, having a clock input terminal, a control terminal and an output terminal, wherein the clock input terminal is coupled to the output terminal of the first fractional frequency-dividing unit;

a second NAND gate, having a first input terminal, a second input terminal and an output terminal, wherein the first input terminal is coupled to the second output terminal of the multiplexer, the second input terminal is coupled to the second input terminal of the first NOR gate, and the output terminal is coupled to the control terminal of the second fractional frequency-dividing unit;

a second NOR gate, having a first input terminal, a second input terminal and an output terminal, wherein the output terminal is coupled to the second input terminal of the first NOR gate, and the first input terminal is coupled to the output terminal of the second fractional frequency-dividing unit;

a third fractional frequency-dividing unit, having a clock input terminal, a control terminal and an output terminal, wherein the clock input terminal is coupled to the first input terminal of the second NOR gate, and the control terminal is coupled to the second input terminal of the second NOR gate;

an OR gate, having a first input terminal, a second input terminal and an output terminal, wherein the output terminal is coupled to the second input terminal of the second NOR gate, and the first input terminal is coupled to the output terminal of the third fractional frequency-dividing unit;

a fourth fractional frequency-dividing unit, having a clock input terminal, a control terminal and an output terminal, wherein the clock input terminal is coupled to the output terminal of the third fractional frequency-dividing unit, and the output terminal outputs the feedback clock;

a first NOT gate, having an input terminal and an output terminal, wherein the input terminal is coupled to the second input terminal of the OR gate, and the output terminal is coupled to the control terminal of the fourth fractional frequency-dividing unit; and a second NOT gate, having an input terminal and an output terminal, wherein the input terminal is coupled to the output terminal of the fourth fractional frequency-dividing unit, and the output terminal is coupled to the input terminal of the first NOT gate; and a spread spectrum module, coupled to the PLL module, for dynamically adjusting frequency of the output clock, the spread spectrum module comprising:

a counter, for generating N counting signals according to a feedback clock, wherein N is an integer greater than 1, and the counter determines a counting direction according to a counting control signal;

N delta-sigma counters, for accumulating the counting signals and N−1 overflow shifting values, and generating the first overflow signal and N−1 second overflow signals; and N−1 data shifters, respectively coupled between two of the delta-sigma counters, wherein each of the data shifters receives one of N−1 shifting values and shifts one of the second overflow signals to generate one of the overflow shifting values.

4. The spread spectrum clock generating apparatus as claimed in claim 3, wherein the first fractional frequency-dividing unit comprises:

a first double edge triggered flip-flop, having a clock terminal, a data terminal and an output terminal, wherein the clock terminal is coupled to the clock input terminal of the first fractional frequency-dividing unit;

a first NAND gate, having an output terminal, an input terminal and an inverted input terminal, wherein the input terminal is coupled to the control terminal of the first fractional frequency-dividing unit, and the output terminal is coupled to the data terminal of the first double edge triggered flip-flop;

a second NAND gate, having an output terminal, a first input terminal and a second input terminal, wherein the first input terminal is coupled to the output terminal of the first double edge triggered flip-flop, and the second input terminal is coupled to the inverted input terminal of the first NAND gate; and a second double edge triggered flip-flop, having a clock terminal, a data terminal, and an output terminal, wherein the clock terminal is coupled to the clock input terminal of the first fractional frequency-dividing unit, the data terminal is coupled to the output terminal of the second NAND gate, and the output terminal is coupled to the output terminal of the first fractional frequency-dividing unit.

5. The spread spectrum clock generating apparatus as claimed in claim 4, wherein the first double edge triggered flip-flop comprises:

a first NOT gate, having an input terminal and an output terminal, wherein the input terminal is coupled to the clock terminal of the first double edge triggered flip-flop;

a first transmission gate, having an input terminal, an output terminal, a first clock terminal and a second clock terminal, wherein the input terminal is coupled to the data terminal of the first double edge triggered flip-flop, the first clock terminal is coupled to the output terminal of the first NOT gate, and the second clock terminal is coupled to the input terminal of the first NOT gate;

a second NOT gate, having an input terminal and an output terminal, wherein the input terminal is coupled to the output terminal of the first transmission gate;

a second transmission gate, having an input terminal, an output terminal, a first clock terminal and a second clock terminal, wherein the input terminal is coupled to the output terminal of the second NOT gate, the first clock terminal is coupled to the input terminal of the first NOT gate, and the second clock terminal is coupled to the output terminal of the first NOT gate;

a third NOT gate, having an input terminal and an output terminal, wherein the input terminal is coupled to the output terminal of the second transmission gate, and the output terminal is coupled to the output terminal of the first double edge triggered flip-flop;

a third transmission gate, having an input terminal, an output terminal, a first clock terminal and a second clock terminal, wherein the input terminal is coupled to the input terminal of the first transmission gate, the first clock terminal is coupled to the input terminal of the first NOT gate, and the second clock terminal is coupled to the output terminal of the first NOT gate;

a fourth NOT gate, having an input terminal and an output terminal, wherein the input terminal is coupled to the output terminal of the third transmission gate; and a fourth transmission gate, having an input terminal, an output terminal, a first clock terminal and a second clock terminal, wherein the input terminal is coupled to the output terminal of the fourth NOT gate, the first clock terminal is coupled to the output terminal of the first NOT gate, the second clock terminal is coupled to the input terminal of the first NOT gate, and the output terminal is coupled to the input terminal of the third NOT gate.

* * * * *